United States Patent
Patel et al.

(10) Patent No.: US 7,426,453 B2
(45) Date of Patent: Sep. 16, 2008

(54) WORKLOAD PLACEMENT BASED UPON CRAC UNIT CAPACITY UTILIZATIONS

(75) Inventors: Chandrakant D. Patel, Fremont, CA (US); Cullen E. Bash, San Francisco, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 371 days.

(21) Appl. No.: 11/035,320

(22) Filed: Jan. 14, 2005

(65) Prior Publication Data
US 2006/0161307 A1 Jul. 20, 2006

(51) Int. Cl.
G06F 5/01 (2006.01)
(52) U.S. Cl. .............. 702/185; 702/184; 702/188; 702/193
(58) Field of Classification Search ............. 702/127, 702/183, 185, 187, 188, 194, 132, 182, 184; 361/687; 454/184; 709/224; 62/3.3
See application file for complete search history.

(56) References Cited

U.S. PATENT DOCUMENTS 6,574,104 B2 * 6/2003 Patel et al. .................. 361/695
6,834,811 B1 * 12/2004 Huberman et al. ........ 236/49.3
6,862,179 B2 * 3/2005 Beitelmal et al. ........... 361/687
6,896,612 B1 * 5/2005 Novotny ..................... 454/184
6,980,433 B2 * 12/2005 Fink .......................... 361/690
7,046,514 B2 * 5/2006 Fink et al. .................. 361/695
2006/0047808 A1 * 3/2006 Sharma et al. .............. 709/224

OTHER PUBLICATIONS

Beitelmal, M. et al., "Thermo-Fluids Provisioning of a High Performance Density Data Center", HP Laboratories Palo Alto, HPL-2004-146, Sep. 2004.
Bodas, D., "New Server Power-Management Technologies Address Power and Cooling Challenges", Technology@Intel Magazine, Sep. 2003.
Patel, C. et al, "Thermal Consideration in Cooling Large Scale High Compute Density Data Centers", HP Laboratories, Palo Alto, CA, Jun. 2002.
Sharma, R. et al, "Balance of Power: Dynamic Thermal Management for Internet Data Centers", HP Laboratories Palo Alto, HPL-2003-5, Feb. 2003.
http://www.amd.com/us-en/Corporate/VirtualPressRoom/0,,51_104_543~92637,00.html, Dec. 6, 2004.

* cited by examiner

Primary Examiner—Eliseo Ramos-Feliciano
Assistant Examiner—Felix Suarez

(57) ABSTRACT

In a method of workload placement based upon capacity utilizations of a plurality of CRAC units, the provisioning of the plurality of CRAC units is determined and the zone of influence for each of the plurality of CRAC units is also determined based upon the provisioning of the plurality of CRAC units. It is determined whether a CRAC unit of the plurality of CRAC units is at least one of near failure or has failed. In addition, the workload is shifted from a zone of influence of at least one CRAC unit to a zone of influence of another of the plurality of CRAC units in response to a determination that a CRAC unit is at least one of near failure or has failed.

25 Claims, 7 Drawing Sheets

WORKLOAD PLACEMENT BASED UPON CRAC UNIT CAPACITY UTILIZATIONS

BACKGROUND

A data center may be defined as a location, for instance, a room that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices that dissipate relatively significant amounts of heat during their operation. For example, a typical computer system comprising multiple microprocessors dissipates approximately 250 W of power. Thus, a rack containing forty (40) computer systems of this type dissipates approximately 10 KW of power.

In relatively large data centers, a plurality of computer room air conditioning (CRAC) units are variously positioned to provide cooling airflow to the computer systems. In this regard, the CRAC units are typically positioned to provide cooling airflow to respective ones of the computer systems. If one of the CRAC units were to fail in providing sufficient levels of cooling airflow to its associated computer systems, those computer systems will also begin to fail shortly following the CRAC unit failure, assuming those associated computer systems are not receiving adequate cooling airflow from another CRAC unit. The failures in those computer systems are likely to cause delays in the performance of various computing functions or cause the various computing functions to shutdown completely. The costs associated with the delays or shutdowns may be relatively high if the CRAC unit failure is not fixed in a relatively short period of time.

Thus, it would be desirable to be able to mitigate the losses in productivity associated with CRAC unit failures.

SUMMARY

A method of workload placement based upon capacity utilizations of a plurality of CRAC units is disclosed herein. In the method, the provisioning of the plurality of CRAC units is determined and the zone of influence for each of the plurality of CRAC units is also determined based upon the provisioning of the plurality of CRAC units. It is determined whether a CRAC unit of the plurality of CRAC units is at least one of near failure or has failed. In addition, the workload is shifted from a zone of influence of at least one CRAC unit to a zone of influence of another of the plurality of CRAC units in response to a determination that a CRAC unit is at least one of near failure or has failed.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

As described in greater detail herein below, the loss in productivity due to a computer room air conditioning (CRAC) unit failure may substantially be mitigated through various workload placement techniques. Broadly speaking, the workload performed by components, for instance, computer systems, servers, and the like, in a zone of influence of a CRAC unit that has failed or is likely to fail may be shifted to components in the zones of influence of the other CRAC units. If it is determined that the shifting of the workload results in unsafe provisioning levels, the power states of the components in a given area may be lowered.

The power management of the components may also be controlled to generally ensure that there is sufficient capacity in the CRAC units to perform all of the workload in the event of a CRAC unit failure. As described below, the actual loads on the CRAC units may be compared to a threshold loading level and the power states of the components may scaled down if the actual loads exceed the threshold loading level.

Figure 1A:
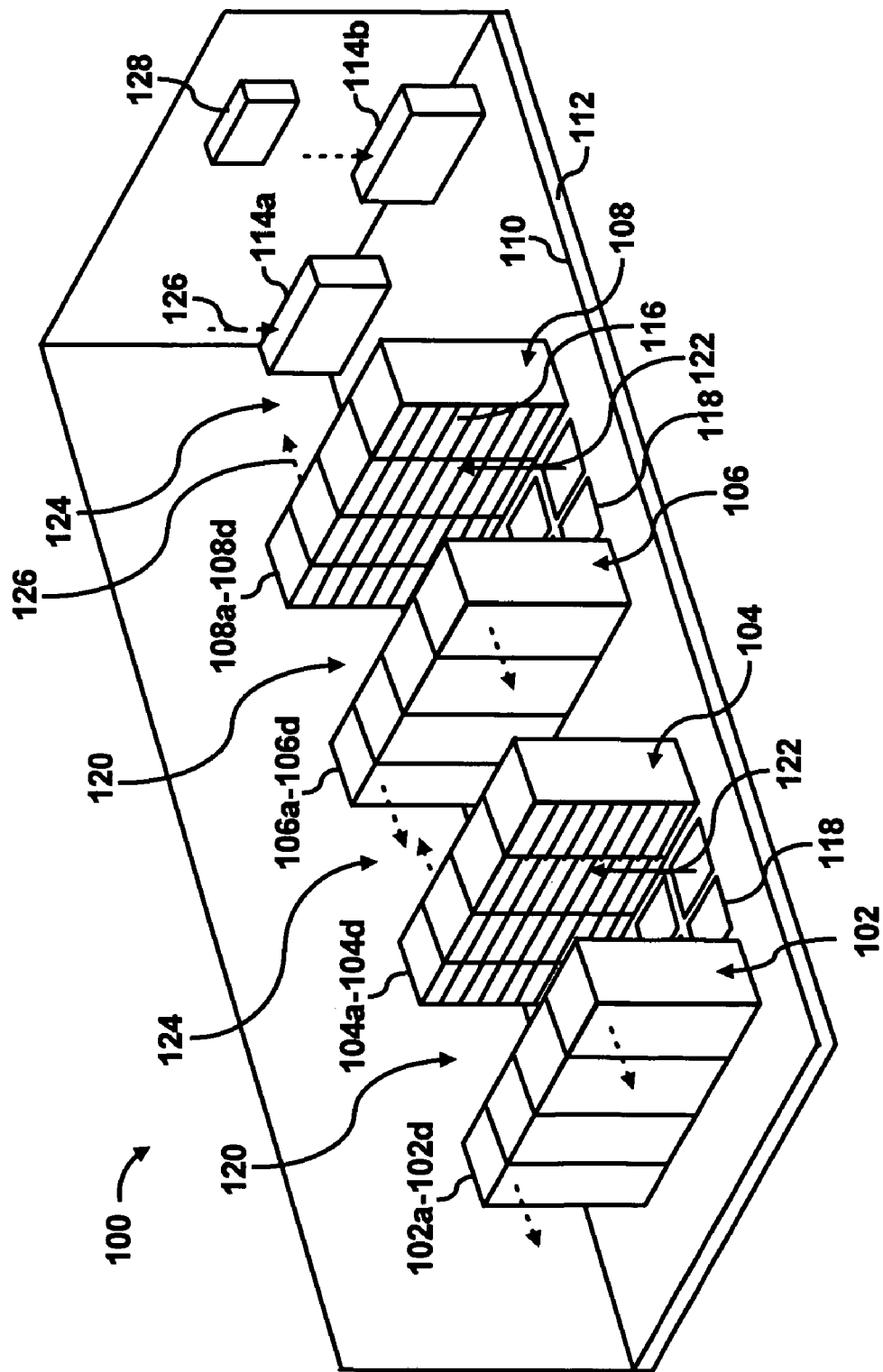
FIG. 1A shows a simplified perspective view of a section of a data center, according to an embodiment of the invention.

With reference first to FIG. 1A, there is shown a simplified perspective view of a section of a data center 100 which may employ various examples of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

It should be readily apparent that the data center 100 depicted in FIG. 1A represents a generalized illustration and that other components may be added or existing components may be removed or modified without departing from the scope of the invention. For example, the data center 100 may include any number of racks and various other components. In addition, it should also be understood that heat generating/dissipating components may be located in the data center 100 without being housed in racks.

The data center 100 is depicted as having a plurality of racks 102-108, for instance, electronics cabinets, aligned in parallel rows. Each of the rows of racks 102-108 is shown as containing four racks (a-d) positioned on a raised floor 110. A plurality of wires and communication lines (not shown) may be located in a space 112 beneath the raised floor 110. The space 112 may also function as a plenum for delivery of cooled air from one or more computer room air conditioning (CRAC) units 114a and 114b to the racks 102-108. The cooled air may be delivered from the space 112 to the racks 102-108 through vent tiles 118 located between some or all of the racks 102-108. The vent tiles 118 are shown as being located between racks 102 and 104 and 106 and 108.

As previously described, the CRAC units 114a and 114b generally operate to supply cooled air into the space 112. The cooled air contained in the space 112 may include cooled air supplied by one or more CRAC units 114a and 114b. Thus, characteristics of the cooled air, such as, temperature, pressure, flow rate, etc., may substantially be affected by one or more of the CRAC units 114a and 114b. By way of example, the cooled air supplied by one CRAC unit 114a may mix with cooled air supplied by another CRAC unit 114b. In this regard, characteristics of the cooled air at various areas in the space 112 and the cooled air supplied to the racks 102-108 may vary, for instance, if the temperatures or the volume flow rates of the cooled air supplied by these CRAC units 114a and 114b differ due to mixing of the cooled air. In certain instances, the level of influence of a CRAC unit 114a and 114b over the racks 102-108 may be higher for those racks 102-108 that are in closer proximity to the respective CRAC units 114a and 114b. In addition, the level of influence of a CRAC unit 114a and 114b over the racks 102-108 may be lower for those racks 102-108 that are located farther away from the CRAC unit 114a and 114b. Those racks 102-108 receiving a predetermined level of cooling airflow from a particular CRAC unit 114a is considered as being within that CRAC unit's 114a zone of influence. Various manners in which the zones of influence of the CRAC units 114a and 114b are described in greater detail herein below with respect to FIG. 1B.

The vent tiles 118 may comprise manually or remotely adjustable vent tiles. In this regard, the vent tiles 118 may be manipulated to vary, for instance, the mass flow rates of cooled air supplied to the racks 102-108. In addition, the vent tiles 118 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104 patent, the vent tiles 118 are termed "dynamically controllable" because they generally operate to control at least one of velocity, volume flow rate and direction of the cooled airflow therethrough. In addition, specific examples of dynamically controllable vent tiles 118 may be found in U.S. Pat. No. 6,694,759, filed on Jan. 27, 2003, which is assigned to the assignee of the present invention and is incorporated by reference herein in its entirety.

The racks 102-108 are generally configured to house a plurality of components 116 capable of generating/dissipating heat (not shown), for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like. In the performance of these electronic functions, the components, and therefore the subsystems, may generally dissipate relatively large amounts of heat. Because the racks 102-108 have generally been known to include upwards of forty (40) or more subsystems, they may transfer substantially large amounts of heat to the cooled air flowing therethrough to maintain the subsystems and the components generally within predetermined operating temperature ranges.

The areas between the racks 102 and 104 and between the racks 106 and 108 may comprise cool aisles 120. These aisles are considered "cool aisles" because they are configured to receive cooled airflow from the vent tiles 118, as generally indicated by the arrows 122. In addition, the racks 102-108 generally receive cooled air from the cool aisles 120. The aisles between the racks 104 and 106, and on the rear sides of racks 102 and 108, are considered hot aisles 124. These aisles are considered "hot aisles" because they are positioned to receive air that has been heated by the components 116 in the racks 102-108, as indicated by the arrows 126. By substantially separating the cool aisles 120 and the hot aisles 124, for instance, with the racks 102-108, the heated air may substantially be prevented from re-circulating with the cooled air prior to delivery into the racks 102-108. In addition, the cooled air may also substantially be prevented from re-circulating with the heated air prior to returning to the CRAC units 114a and 114b. However, there may be areas in the data center 100 where re-circulation of the cooled air and the heated air occurs. By way of example, cooled air may mix with heated air around the sides or over the tops of one or more of the racks 102-108.

The sides of the racks 102-108 that face the cool aisles 120 may be considered as the fronts of the racks and the sides of the racks 102-108 that face away from the cool aisles 120 may be considered as the rears of the racks 102-108. For purposes of simplicity and not of limitation, this nomenclature will be relied upon throughout the present disclosure to describe the various sides of the racks 102-108.

According to another example, the racks 102-108 may be positioned with their rear sides adjacent to one another (not shown). In this embodiment, the vent tiles 118 may be provided in each aisle 120 and 124. In addition, the racks 102-108 may comprise outlets on top panels thereof to enable heated air to flow out of the racks 102-108.

As described herein above, the CRAC units 114a and 114b generally operate to cool received heated air as indicated by the arrows 126. In addition, the CRAC units 114a and 114b may supply the racks 102-108 with airflow that has been cooled, through any reasonably suitable known manners and may thus comprise widely available, conventional CRAC units 114a and 114b. For instance, the CRAC units 114a and 114b may comprise vapor-compression type air conditioning units, chiller type air conditioning units, etc. Examples of suitable CRAC units 114a and 114b may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

Also shown in FIG. 1A is a resource manager 128 configured to control various operations of the data center 100. The resource manager 128 may operate, for instance, to control the vent tiles 118 to thereby vary at least one of a direction and a volume flow rate of cooled airflow delivered through the vent tiles 118. The resource manager 128 may also operate to vary the power states of the components 116 as described in greater detail herein below. As also described herein below, the resource manager 128 may operate to vary workload among variously located components 116 in response to failure in a CRAC unit 114a. In addition, the resource manager 128 may vary the workload among variously located components 116 in preparation of, or in response to, a potential CRAC unit 114a failure. Although the computing device 128 is illustrated in FIG. 1A as comprising a component separate from the components 116 housed in the racks 102-108, the computing device 128 may comprise one or more of the components 116 without departing from a scope of the data center 100 disclosed herein.

The data center 100 is illustrated in FIG. 1A as containing four rows of racks 102-108 and two CRAC units 114a and 114b for purposes of simplicity and illustration. Thus, the data center 100 should not be construed as being limited in any respect to the number of racks 102-108 and CRAC units 114a and 114b illustrated in FIG. 1A. In addition, although the racks 102-108 have all been illustrated similarly, the racks 102-108 may comprise heterogeneous configurations. For instance, the racks 102-108 may be manufactured by different companies or the racks 102-108 may be designed to house differing types of components 116, for example, horizontally mounted servers, bladed servers, etc.

Figure 1B:
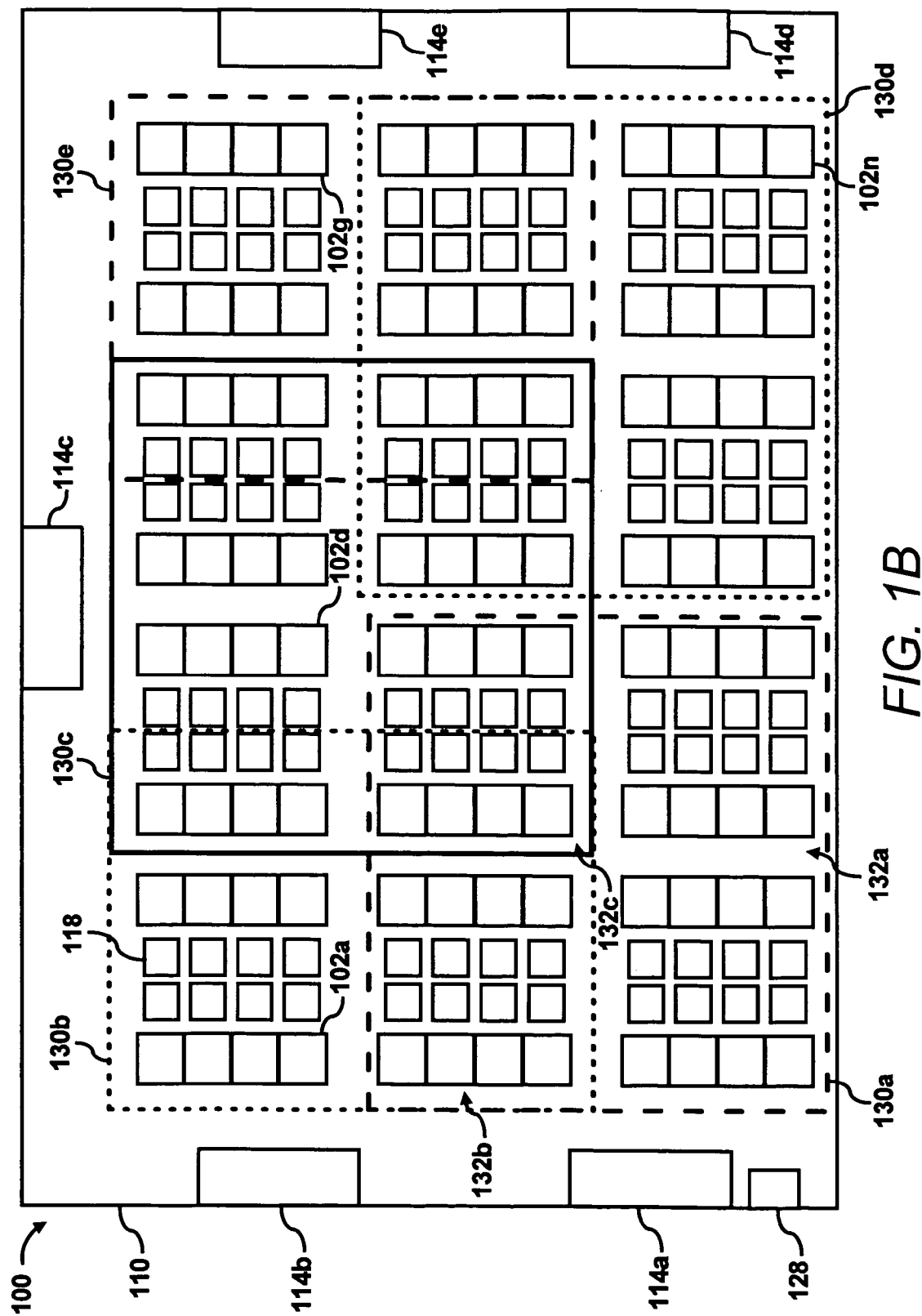
FIG. 1B shows a simplified plan view of the data center depicted in FIG. 1A.

With reference now to FIG. 1B, there is shown a simplified plan view of the data center 100 depicted in FIG. 1A. The data center 100 is shown as including CRAC units 114a-114e positioned at various locations throughout the data center 100. The CRAC units 114c-114e may generally comprise the same or similar configurations as the CRAC units 114a and 114b described herein above. A plurality of vent tiles 118 are also illustrated in FIG. 1B and are configured to deliver cooling airflow to racks 102a-102n located in respective vicinities of the vent tiles 118. The racks 102a-102n have been labeled with the reference numerals 102a-102n for purposes of simplicity and are generally intended to refer to the same racks 102-108 depicted in FIG. 1A. In addition, the reference character "n" represents any integer number greater than 1. In this regard, the data center 100 may include any number of racks 102a-102n and is not limited to the number of racks 102a-102n illustrated in FIG. 1B.

As described herein above, the vent tiles 118 and the racks 102a-102n are positioned on a raised floor 110, beneath which lies a space 112 (FIG. 1A). The space 112 is in fluid communication with the CRAC units 114a-114e and generally operates, in one respect, as a plenum for supplying cooling airflow from the CRAC units 114a-114e to be delivered through the vent tiles 118. In most instances, the space 112 may comprise a relatively open space that is accessible by cooling airflow supplied by a plurality of the CRAC units 114a-114e. In this regard, the cooling airflow supplied by the CRAC units 114a-114e may mix in the space 112. Therefore, the cooling airflow supplied to the racks 102a-102n by the vent tiles 118 may have originated from more than one of the CRAC units 114a-114e.

The CRAC units 114a-114e thus influence respective areas in the data center 100. In addition, each of the CRAC units 114a-114e may influence the respective areas to a certain extent. The racks 102a-102n over which the CRAC units 114a-114e have a predetermined level of influence are considered herein as being within the zone of influence 130a-130e of the respective CRAC units 114a-114e. Thus, those racks 102a-102n that receive cooling airflow from a CRAC unit at a level that is below the predetermined level may be considered as being outside of that CRAC unit's zone of influence. The predetermined level may be determined based upon a plurality of factors. The factors may include, for instance, a minimum level of cooling airflow required from a CRAC unit 114a to safely operate the components 116 in the rack 102a-102n should the other CRAC units 114b-114e fail. As another example, the predetermined level may be set to a predetermined percentage level.

FIG. 1B illustrates an example of the respective zones of influence 130a-130e of the CRAC units 114a-114e. The zones of influence 130a-130e of the respective CRAC units 114a-114e may be determined through various thermodynamic modeling techniques. An example of a suitable modeling technique is described in Patel et al., "Thermal Considerations in Cooling Large Scale High Compute Density Data Centers", Itherm 2002, the disclosure of which is incorporated herein by reference in its entirety. Thus, for instance, through various modeling techniques, the levels of influence the CRAC units 114a-114e have over particular racks 102a-102n may be determined and mapped as shown in FIG. 1B.

In addition, or alternatively, the zones of influence 130a-130e of the CRAC units 114a-114e may be determined through individually testing for the influences of each of the CRAC units 114a-114e over each of the racks 102a-102n. A commissioning process may also be employed to determine the influences each of the CRAC units 114a-114e have over respective ones of the racks 102a-102n. It should, in any regard, be understood that the zones of influence 130a-130e depicted in FIG. 1B are for purposes of illustration and are not intended to limit the data center 100 and its components in any respect.

In any regard, as shown in FIG. 1B, some of the racks, for instance, the racks in a first section 132a may be included in the zone of influence 130a of a single CRAC unit 114a. Some of the other racks, for instance, the racks in a second section 132b may be included in the zones of influence 130a and 130b of two CRAC units 114a and 114b. In addition, some of the racks, for instance, the racks in a third section 132c may be included in the zones of influence 130a-130c of three CRAC units 114a-114c. As such, for example, if the CRAC unit 114a were to fail, the racks in the first section 132a of the zone of influence 130a would not receive adequate levels of cooling fluid because they are not within any of the other CRAC unit's zone of influence.

As will be described in greater detail herein below, the components 116 located within the zone of influence of a failed CRAC unit may be powered down when certain conditions are met. In addition, the components 116 located within the zone of influence of an operational CRAC unit may be powered up and may have the workload from the powered down components 116 shifted thereon. Again, the shifting of the workload may occur when certain conditions are met as described in greater detail herein below.

Figure 2:
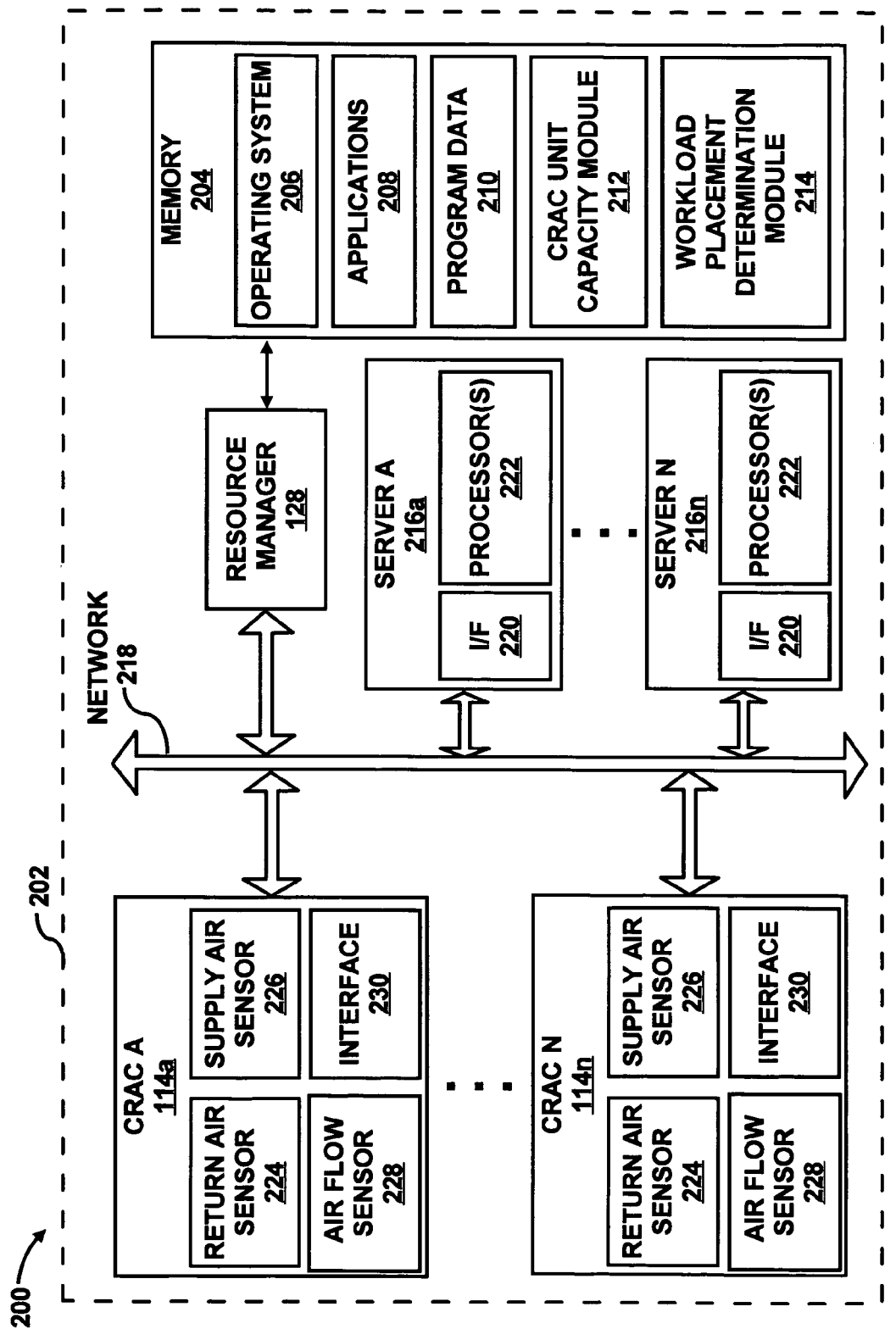
FIG. 2 is a block diagram of a workload placement system according to an embodiment of the invention.

FIG. 2 is a block diagram 200 of a workload placement system 202. It should be understood that the following description of the block diagram 200 is but one manner of a variety of different manners in which such a workload placement system 202 may be configured. In addition, it should be understood that the workload placement system 202 may include additional components and that some of the components described herein may be removed and/or modified without departing from the scope of the invention. For instance, the workload placement system 202 may include any number of sensors, servers, CRAC units, etc., as well as other components, which may be implemented in the operations of the workload placement system 202.

As shown, the workload placement system 202 includes the resource manager 128 depicted in FIGS. 1A and 1B. As described hereinabove, the resource manager 128 is configured to perform various functions in the data center 100. In this regard, the resource manager 128 may comprise a computing device, for instance, a computer system, a server, etc. In addition, the resource manager 128 may comprise a microprocessor, a micro-controller, an application specific integrated circuit (ASIC), and the like, configured to perform various processing functions. In one respect, the resource manager 128 may comprise a controller of another computing device.

The resource manager 128 is illustrated as being connected to a memory 204. However, in certain instances, the memory 204 may form part of the resource manager 128 without departing from a scope of the workload placement system 202. Generally speaking, the memory 204 may be configured to provide storage of software, algorithms, and the like, that provide the functionality of the resource manager 128. By way of example, the memory 204 may store an operating system 206, application programs 208, program data 210, and the like. In this regard, the memory 204 may be implemented as a combination of volatile and non-volatile memory, such as DRAM, EEPROM, MRAM, flash memory, and the like. In addition, or alternatively, the memory 204 may comprise a device configured to read from and write to a removable media, such as, a floppy disk, a CD-ROM, a DVD-ROM, or other optical or magnetic media.

The memory 204 may also store a CRAC unit capacity module 212, which the resource manager 128 may implement to perform various functions with respect to information pertaining to the CRAC units 114a-114n. For instance, the CRAC unit capacity module 212 may be employed to determine the actual loads on the CRAC units 114a-114n based upon various sensed information as described herein below. The actual loads may be used to determine the levels to which the capacities of the CRAC units 114a-114n are being utilized.

The CRAC unit capacity module 212 may also be implemented to access information pertaining to the rated capacities of the CRAC units 114a-114n, which may be stored, for instance, in the program data 210. The rated capacities may pertain to the operating limits set forth by the CRAC unit 114a-114n manufacturers or limits determined through testing. In other instances, the rated capacities may comprise user-defined limits based upon one or more criteria as described herein below. In any regard, the CRAC unit capacity module 212 may also calculate and compare the difference between the actual loads and the rated capacities of the CRAC units 114a-114n.

According to an example, the resource manager 128 may be configured to generate a plurality of maps that may be employed to visualize or characterize various conditions in the data center 100. For instance, the resource manager 128 may generate maps of the performance capacities of the CRAC units 114a-114n, maps of the cooling capacities, including the zones of influence, of the CRAC units 114a-114n, maps of the actual resource utilizations, and maps of the actual cooling loads. Some or all of the maps may be generated through use of a computational fluid dynamics modeling program. Others of the maps may be generated through use of the information obtained by the resource manager 128 regarding, for instance, the actual loads and rated capacities of the CRAC units 114a-114n. As will be described in greater detail herein below, one or more of these maps may be employed to determine when and where workload is to be shifted.

A workload placement determination module 214 may also be stored in the memory 204. The workload placement determination module 214 generally operates to determine how and where workloads should be placed based upon the actual load determinations made by the CRAC unit capacity module 212. The resource manager 128 may implement the CRAC unit capacity module 212 and the workload placement determination module 214 in controlling at least one or both of the power states and the workloads on servers 216a-216n positioned in various zones of influence 130a-130n (FIG. 1B). In one respect, the resource manager 128 may vary at least one or both of the power states and the workloads on the servers 216a-216n to generally ensure that there is sufficient capacity in the CRAC units 114a-114n to compensate for failures in one or more of the CRAC units 114a-114n. In another respect, the resource manager 128 may vary at least one or both of the power states and the workloads on the servers 216a-216n in response to or in preparation of the failure of one or more of the CRAC units 114a-114n.

In addition, or alternatively, the resource manager 128 may generate maps configured to forecast how proposed workload shifts will affect, for instance, the loading on the operational CRAC units 114a-114n. The forecast maps may also be generated through use of a computational fluid dynamics modeling program, with the projected conditions being used as inputs in the modeling algorithm. Through use of these forecast maps, the potential impacts on the conditions in the data center 100 with the shifted workload may be determined prior to the actual implementation of the workload shifts. In addition, these forecast maps may generally ensure that the load placed after satisfying all of the policies receives sufficient levels of cooling airflow.

According to an example, the forecast maps may be generated prior to a CRAC unit 114a-114n failure or potential failure. In this regard, for instance, one or more forecast maps may be generated during a modeling of the data center 100. In this example, a plurality of maps may be generated depicting various failure mitigation scenarios. These maps may be relied upon to relatively quickly determine an appropriate failure mitigation scenario in the event of a CRAC unit 114a-114n failure or potential failure.

The use of the reference character "n" for the CRAC units 114a-114n and the servers 116a-116n is to represent any integer number greater than 1. The ellipses "..." also indicate that a number of CRAC units "n−1" and a number of servers "n−1" are included in the workload placement system 202. In this regard, the workload placement system 202 may include any number of CRAC units 114a-114n and servers 116a-116n and is not limited to the number of CRAC units 114a-114n and servers 116a-116n illustrated in FIG. 2.

Instructions from the resource manager 128 may be transmitted over a network 218 that operates to couple the various components of the workload placement system 202. Although not shown, the resource manager 128 may be equipped with software and/or hardware to enable the resource manager 128 to transmit and receive data over the network 218. The network 218 generally represents a wired or wireless structure in the data center 100 for the transmission of data between the various components of the workload placement system 202. The network 218 may comprise an existing network infrastructure or it may comprise a separate network configuration installed for the purpose of workload placement by the resource manager 128.

In any respect, the servers 216a-216n may be interfaced with the network 218 through respective interfaces (I/F) 220. The interfaces 220 may include any reasonably suitable known hardware and/or software capable of enabling data communications between the servers 216a-216b and other components, including the resource manager 128, over the network 218. Each of the servers 216a-216n also include at least one processor 222 configured to perform various operations in manners generally known in the art. According to one example, the resource manager 128 may control the performance or p-states of the processor(s) 222 to at least one or both of prepare and compensate for CRAC unit failure. In another example, the resource manager 128 may operate under automatic control of power consumption (ACPC) to control the power consumption of the servers 216a-216n.

Manners in which the performance or p-states may be modified and the ACPC may be implemented are described in, Bodas, Devas "New Server Power-Management Technologies Address Power and Cooling Challenges", Technology@Intel Magazine, 2003. The disclosure contained in that article is incorporated by reference herein in its entirety. Another example of a suitable manner in which the performance or power states of the servers 216a-216n may be modified is the POWERNOW! technology available from Advanced Micro Devices of Sunnyvale, Calif.

In making determinations of how to control the performance or p-states of the processors 222, or in shifting the workload among the servers 216a-216n, the resource manager 128 may rely upon the determinations made through implementation of the CRAC unit capacity module 212 and the workload placement module 214. These determinations may be based upon information received from sensors variously positioned with respect to respective CRAC units 114a-114n. More particularly, respective return air sensors 224 may be positioned to detect the temperatures of the return air received by each of the CRAC units 114a-114n. Respective supply air sensors 226 may be positioned to detect the temperatures of the air supplied by each of the CRAC units 114a-114n. The return air sensors 224 and the supply air sensors 226 may comprise any reasonably suitable sensors capable of detecting the temperature of air. The sensors 224 and 226 may thus comprise thermistors, thermometers, thermocouples, etc. The resource manager 128 may consider additional factors in selecting which of the servers 204a-204n to place the workload. The additional factors may include, for instance, the terms contained in a Service Level Agreement, security levels of the servers 216a-216n, processor speeds, etc.

Air flow sensors 228 may also be positioned at respective output locations of the CRAC units 114a-114n to detect the flow rate of the cooled airflow supplied by each of the CRAC units 114a-114n. The air flow sensors 228 may also comprise any reasonably suitable sensor capable of detecting the flow rate of air supplied by the CRAC units 114a-114n. In addition, the temperature sensors 224, 226 and/or the air flow sensors 228 may comprise sensors that have been integrally manufactured with the CRAC units 114a-114n or they may comprise sensors that have been positioned with respect to each of the CRAC units 114a-114n following their installations in the data center 100. In any respect, the condition information detected by these sensors 224-228 may be transmitted to the resource manager 128 through the network 218.

The illustration of the temperature sensors 224, 226 and the air flow sensors 228 as forming part of respective CRAC units 114a-114n is to depict the correlation between the respective CRAC units 114a-114n and the sensors 224-228. Thus, the sensors 224-228 should not be construed as necessarily forming part of the CRAC units 114a-114n.

In this regard, the CRAC units 114a-114n may include respective interfaces 230 that generally enable data transfer between the CRAC units 114a-114n and the resource manager 128 over the network 218. The interfaces 230 may comprise any reasonably suitable hardware and/or software capable to enabling the data transfer.

The resource manager 128 may also receive information pertaining to the rated capacities of the CRAC units 114a-114n. The rated capacities may pertain to, for instance, the operational limits of the CRAC units 114a-114n or the safe and efficient operating capacities as rated by the manufacturers of the CRAC units 114a-114n or as determined through testing of the CRAC units 114a-114n. In addition, or alternatively, this information may be stored in the form of a database in the memory 204.

The memory 204 may also include additional information, such as, correlations between the identifications of the CRAC units 114a-114n and their rated capacities, the locations of the CRAC units 114a-114n, etc. The memory 204 may also store information pertaining to the zones of influence 130a-130e of each of the CRAC units 114a-114n. A user may program some or all of the information contained in the database. Alternatively, this information may be substantially automatically programmed. For instance, the resource manager 128 or another computing device may automatically update the database when CRAC units 114a-114n are removed, added, moved, or modified.

Although the workload placement system 202 has been illustrated as a system contained in a data center 100, various principles described with respect to the workload placement system 202 may be applied to multiple data centers 100. For instance, some or all of the CRAC units 114a-114n and the servers 216a-216n in the zones of influence of those CRAC units 114a-114n may be located in at least one different data center from the resource manager 128. In this example, part or all of the network 218 may comprise the Internet and the resource manager 128, which may be located in a first data center 100, may be configured to transmit and receive data over the Internet to and from CRAC units 114a-114n and servers 216a-216n located in a different data center.

As such, the resource manager 128 may be configured to place the workload among servers 216a-216n located in different data centers, which may also be located in different parts of the world, for instance. An example of an environment in which the resource manager 128 may operate to place the workload in servers 216a-216n that are in different geographic locations from the resource manager 128 may be found in commonly assigned and co-pending U.S. patent application Ser. No. 10/820,786, filed on Apr. 9, 2004, and entitled "Workload Placement Among Data Centers Based Upon Thermal Efficiency", the disclosure of which is hereby incorporated by reference in its entirety. This example provides greater flexibility in ensuring that the workload is performed in response to one or more CRAC units failing.

Figure 3A:
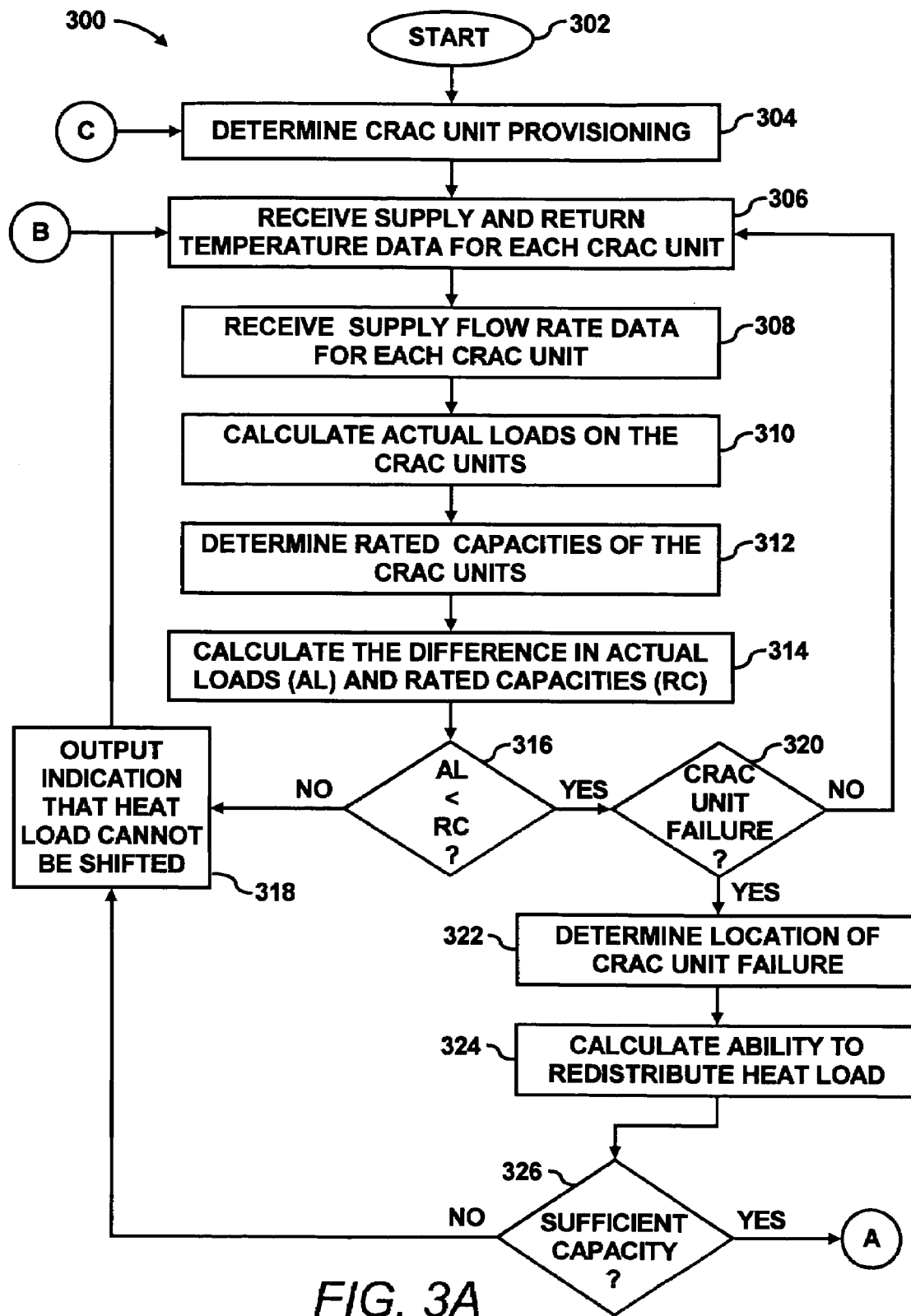
FIGS. 3A and 3B, collectively, illustrate a flow diagram of an operational mode of a method for workload placement among servers based upon CRAC unit capacities, according to an embodiment of the invention.
Figure 3B:
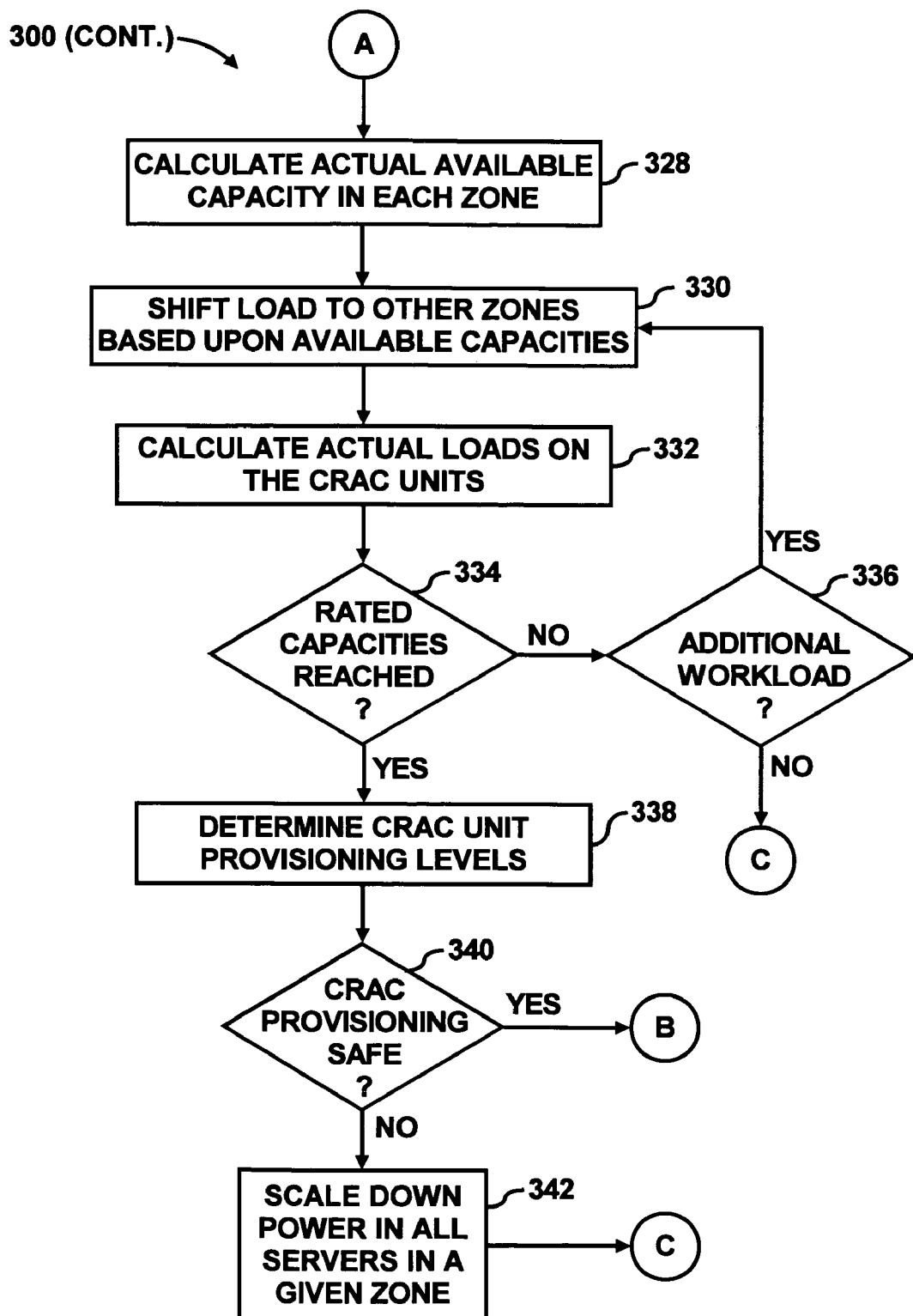

FIGS. 3A and 3B, collectively, illustrate a flow diagram of an operational mode 300 of a method for workload placement among servers based upon CRAC unit capacity utilizations. It is to be understood that the following description of the operational mode 300 is but one manner of a variety of different manners in which an embodiment of the invention may be practiced. It should also be apparent to those of ordinary skill in the art that the operational mode 300 represents a generalized illustration and that other steps may be added or existing steps may be removed, modified or rearranged without departing from a scope of the operational mode 300.

The description of the operational mode 300 is made with reference to the block diagram 200 illustrated in FIG. 2, and thus makes reference to the elements cited therein. It should, however, be understood that the operational mode 300 is not limited to the elements set forth in the block diagram 200. Instead, it should be understood that the operational mode 300 may be practiced by a workload placement system having a different configuration than that set forth in the block diagram 200.

The operational mode 300 may be implemented to track and compensate for actual or potential CRAC unit failures. Thus, for instance, if a CRAC unit were to fail or were determined to be close to failure, the workload being performed or scheduled to be performed by the servers in the zone of influence of that CRAC unit may be shifted to other servers in other zones of influence, provided, for instance, that there is sufficient capacity in the CRAC units serving those other zones of influence. In one regard, the reduction in workflow due to the failure of a CRAC unit may thus be minimized through implementation of the operation mode 300.

The operational mode 300 may be initiated at step 302 in response to any of a number of stimuli or conditions. For instance, the operational mode 300 may be initiated with activation of the components in the data center 100, such as, the CRAC units 114a-114n and/or the servers 216a-216n. In addition, or alternatively, the operational mode 300 may be manually initiated or the resource manager 128 may be programmed to initiate the operational mode 300 at various times, for a set duration of time, substantially continuously, etc.

Once initiated, the resource manager 128 may determine the provisioning of the CRAC units 114a-114n at step 304. The provisioning of the CRAC units 114a-114n may be determined through conventional modeling or metrology techniques using a determined heat load and/or a projected distribution of heat load. In addition, the zones of influence 130a-130e (FIG. 1B) may be determined at step 304.

At step 306, the resource manager 128 may receive the return temperatures of air received and the temperatures of air supplied by each of the CRAC units 114a-114n. In addition, the resource manager 128 may receive flow rate information of airflow supplied by each of the CRAC units 114a-114n at step 308. As described herein above, the temperatures may be detected by respective sensors 224, 226 and the supply airflow rates may be detected by respective sensors 228. In addition, the condition data detected by these sensors 224-228 may be communicated to the resource manager 128 over the network 218.

Based upon the detected condition information received from the sensors 224-228, the resource manager 128 may calculate the actual loads on the CRAC units 114a-114n, at step 310. The resource manager 128 may calculate the actual loads (O) on the CRAC units 1114a-114n through the following equation:

$$Q = \dot{m} C_p (T_{in} - T_{out}).\qquad\text{Equation (1):}$$

According to a first example, in Equation (1), $\dot{m}$ is the mass flow rate of airflow supplied by a CRAC unit 114a-114n and may be in (kg/s), $C_p$ is the specific heat of air, which may be in (J/kg-C), $T_{in}$ is the temperature of airflow received into the CRAC unit 114a-114n, which may be in (° C.), and $T_{out}$ is the temperature of the airflow supplied by the CRAC unit 114a-114n, which may be in (° C.). The actual load (Q) on each of the CRAC units 114a-114n may be in (kW).

According to a second example, the actual loads (Q) may be determined in a water-chiller type CRAC unit through detection of the characteristics of the chilled water flow. In this example, and with reference to Equation (1), $\dot{m}$ is the mass flow rate of water flow through the chiller (kg/s), $C_p$ is the specific heat of water (J/kg-C), $T_{in}$ is the temperature of the water at an inlet of the chiller (° C.), and $T_{out}$ is the temperature of the water at an outlet of the chiller (° C.).

Either of the examples above may be employed to calculate the actual loads on each of the CRAC units 114a-114n without departing from a scope of the operational mode 300.

The rated capacities of the CRAC units 114a-114n may optionally be determined at step 312. Step 312 may be considered as being optional because information pertaining to the rated capacities of the CRAC units 114a-114n may have previously been determined and stored in the memory 204. As described above, the rated capacities of the CRAC units 114a-114n may be set by the CRAC unit manufacturers or these capacities may be determined through testing and may vary from one CRAC unit 114a to another CRAC unit 114b, for instance. In addition, or alternatively, the rated capacities of the CRAC units 114a-114n may be selected based upon one or both of the most energy efficient and least sound-producing operation. Thus, the ratings for the capacities may be selected based upon any number of criteria, for instance, a CRAC unit 114a with a maximum capacity of 100 kW may be most efficient at 85 kW, which may be determined, for instance, through hydronics and compressor analysis during commissioning of the data center 100.

At step 314, the resource manager 128 may calculate the difference between the actual loads (AL) on the CRAC units 114a-114n and the rated capacities (RC) of the CRAC units 114a-114n. More particularly, for instance, the resource manager 128 may determine whether the sum of the actual loads (AL) for all of the CRAC units 114a-114n falls below the sum of the rated capacities (RC) for all of the CRAC units 114a-114n, as indicated at step 316. If the resource manager 128 determines that the actual loads exceed or equal the rated capacities, the resource manager 128 may output an indication that the heat load cannot be shifted as indicated at step 318. In other words, the resource manager 128 may determine and may indicate that there is insufficient cooling capacity in the CRAC units 114a-114n to compensate for the failures of one or more CRAC units 114a-114n.

In a first example, the resource manager 128 may continue with the operational mode 300 by continuing to perform steps 306-316. In addition, in this example, if a CRAC unit failure occurs, the workload may not be shifted from the zone of influence 130a-130e of the CRAC unit that failed since the other CRAC units 114a-114n may have insufficient capacity to accept the additional load.

Figure 4:
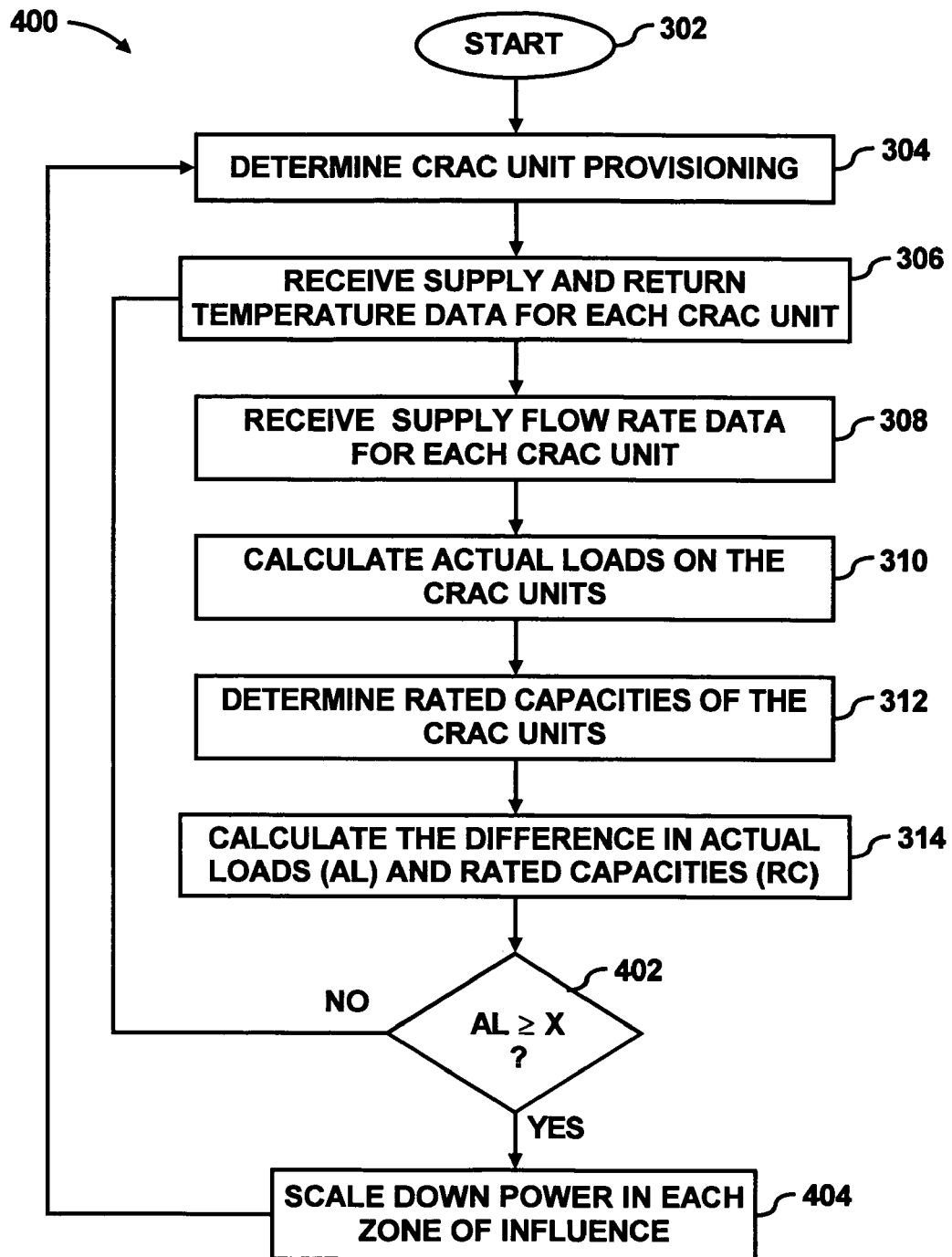
FIG. 4 shows an operational mode of a method for server power management to ensure that there is sufficient capacity in the CRAC units in the event of a CRAC unit failure, according to an embodiment of the invention.

In a second example, the resource manager 128 may perform some or all of the steps outlined in the operational mode 400 (FIG. 4). As described in greater detail herein below, the operational mode 400 may be performed to provide sufficient capacity in the CRAC units 114a-114n to enable the workload performed on servers in a zone of influence 130a-130n of a failed CRAC unit to be shifted to servers in other zones of influence.

At step 316, if it is determined that the sum of the actual loads (AL) of the CRAC units 114a-114n falls below the sum of the rated capacities (RC), the resource manager 128 determine whether a CRAC unit failure has occurred or is potentially likely to occur, as indicated at step 320. The resource manager 128 may determine that a CRAC unit is potentially likely to fail, for instance, if the resource manager 128 detects that the CRAC unit is not operating within certain parameters. If all of the CRAC units 114a-114n are operating within normal guidelines, the resource manager 128 may continue to perform steps 306-320 until a CRAC unit failure is detected at step 320 or until the operational mode 300 is discontinued. The resource manager 128 may determine that a CRAC unit has failed or is likely to fail, for instance, if the resource manger 128 ceases to receive detected condition information from that CRAC unit, if the measurements of the temperature sensors 224, 226 and/or the air flow rate sensor 228 of that CRAC unit indicate that there is a problem, etc.

If, at step 320, a CRAC unit failure or potential failure is detected, the resource manager 128 may determine the location of that CRAC unit at step 322. The resource manager 128 may determine the location of that CRAC unit based upon, for instance, one or more locations in the data center 100 where the temperature is outside of a predetermined range, direct detection of a CRAC unit failure, etc. In any regard, at step 324, the resource manager 128 may calculate the ability in the data center 100 to redistribute the heat load. More particularly, the resource manager 128 may subtract the sum of the rated capacities (RC) from the actual loads (AL) on the CRAC units 114a-114n to accommodate for the failure of a CRAC unit, for instance, CRAC unit 114a.

By way of example, if a data center contains four CRAC units rated at 100 kW each, the sum of their rated capacities would total 400 kW. In addition, if the sum of the actual capacity utilizations of the four CRAC units totaled 250 kW, there would be a buffer of 150 kW. Thus, if a single CRAC unit were to fail, the buffer in the available capacity would be 150 kW.

The resource manager 128 may determine whether the remaining CRAC units 114b-114n have sufficient capacity to receive the workload from the servers 216a-216n contained in the zone 130a, and more particularly from the servers 216a-216n contained in the section 132a, at step 326. The resource manager 128 may determine that the remaining CRAC units 114b-114n have sufficient capacity if there is a buffer in the available capacity as in the example above. If the resource manager 128 determines that there is insufficient capacity, the resource manager 128 may output an indication that the heat load cannot be shifted as indicated at step 318.

If, however, the resource manager 128 determines that there is sufficient capacity, the resource manager 128 may calculate the available capacities in each of the zones 130b-130e of the remaining CRAC units 114b-114n at step 328. Step 328 may include the determination of the types of servers 216a-216n contained in each of the zones 130a-130e to determine, initially, if there are available servers 216a-216n capable of performing the workload contained in the servers 216a-216n in the zone 130a. According to an example, the availabilities of the servers 216a-216n to perform the workload may be determined based upon the available states of the servers 216a-216n as disclosed in commonly assigned and co-pending U.S. patent application Ser. No. 10/929,448, entitled "Workload Placement Based On Thermal Considerations," filed on Aug. 31, 2004, the disclosure of which is hereby incorporated by reference in its entirety. In addition, step 328 may include the determination of whether those servers 216a-216n capable of performing the workload also meet the requirements of any service level agreements, security agreements, and the like.

Assuming that there are servers 216a-216n available to perform the shifted workload, the actual available capacities of the CRAC units 1114b-114n in each of the remaining zones may be calculated by subtracting the respective actual loads from the rated capacities of the CRAC units 114b-114n. In addition, the resource manager 128 may identify which of the CRAC units 114b-114n are being least utilized as those CRAC units 114b-114n that have the highest available capacities. The resource manager 128 may shift the workload from the servers 216a-216n in the zone 130a to the servers 216a-216n in the other zones 130b-130e based upon the available capacities of the CRAC units 114b-114n associated with those zones 130b-130e, at step 330. More particularly, for instance, the resource manager 128 may first shift the workload to those servers 216a-216n in zones 130b-130e having CRAC units 114b-114n with the highest available capacities and so forth.

At step 332, the resource manager 128 may calculate the actual loads on the CRAC units 114b-114n to which the workload has been shifted. The actual loads may be calculated, for instance, in any of the manners described above with respect to step 310. At step 334, the resource manager 128 may determine whether the rated capacities of the CRAC units 114b-114n have been reached by comparing the actual loads calculated at step 332 with the rated capacities of the CRAC units 114b-114n. If it is determined that the rated capacities have not been reached, the resource manager 128 may determine whether there is additional workload to be shifted at step 336. If there is additional workload, steps 330-336 may be repeated. Otherwise, if there is no additional workload to be shifted, the operational mode 300 may be repeated beginning at step 304.

If, at step 334, it is determined that the rated capacities of the CRAC units 114b-114n have been reached, the resource manager 128 may determine the CRAC unit 114b-114n provisioning levels at step 338. The provisioning levels of the CRAC units 114b-114n may be determined in any of the manners described above with respect to step 304.

At step 340, the resource manager 128 may determine whether the provisioning levels of the CRAC units 114b-114n are relatively safe. The provisioning level of a CRAC unit 114b-114n may be considered unsafe if the CRAC unit 114b-114n is operating at a capacity higher than the rated capacity for that CRAC unit. The provisioning level of a CRAC unit 114b-114n may also be considered unsafe if the CRAC unit 114b-114n is operating at or above a predefined threshold percentage of the rated capacity for that CRAC unit. If it is determined that the CRAC units 114b-114n are operating at relatively safe levels, the operational mode 300 may be repeated beginning at step 306. If, however, it is determined that one or more of the CRAC units 114b-114n are operating at unsafe levels, the resource manager 128 may scale down the power in all of the servers 216a-216n in the zone 130b-130e associated with the one or more CRAC units 114b-114n operating at the unsafe levels at step 342. The power in the servers 216a-216n may be scaled down by lowering the performance or the p-states of processor(s) 222 contained in the servers 216a-216n, in any reasonably suitable conventional manner. In addition, the power may be scaled down to safe operating levels for the CRAC units 114a-114n.

Following the scale down of power as indicated at step 342, the operational mode 300 may be repeated beginning at step 304. In addition, the operational mode 300 may be continued for a predetermined length of time, for a predetermined number of iterations, until the operational mode 300 is manually discontinued, etc.

According to another example, the data collected and calculated at some or all of steps 304-314 may be employed to generate a plurality of maps. As described above, the resource manager 128 may generate a plurality of different types of maps which may be used in determining when and where the workload is to be shifted. For instance, in the event that a CRAC unit 114a has failed or is close to failing, the resource manager 128 may generate one or more projected deployment maps to generally forecast how shifting the workload may affect the loading on the CRAC units 114a-114n. The resource manager 128 may compare the projected deployment maps to determine which of the deployment projections provides the most beneficial results. In addition, the resource manager 128 may shift the workload based upon the selected map at step 330.

Although the deployment projection maps have been described as being generated following a determination of a CRAC unit 114a-114n failure or potential failure, the deployment projection maps may be generated at any time prior to that determination. For instance, a plurality of deployment projection maps configured to depict potential failure mitigation scenarios may be generated at any time prior to the determination of a CRAC unit 114a-114n failure or potential failure. In any regard, these maps may be relied upon by the resource manager 128 to relatively quickly determine an appropriate failure mitigation scenario in the event of a CRAC unit 114a-114n failure or potential failure.

With reference now to FIG. 4, there is shown an operational mode 400 of a method for server 216a-216n power management to ensure that there is sufficient capacity in the CRAC units in the event of a CRAC unit failure. It is to be understood that the following description of the operational mode 400 is but one manner of a variety of different manners in which an embodiment of the invention may be practiced. It should also be apparent to those of ordinary skill in the art that the operational mode 400 represents a generalized illustration and that other steps may be added or existing steps may be removed, modified or rearranged without departing from the scope of the operational mode 400.

The description of the operational mode 400 is made with reference to the block diagram 200 illustrated in FIG. 2, and thus makes reference to the elements cited therein. It should, however, be understood that the operational mode 400 is not limited to the elements set forth in the block diagram 200. Instead, it should be understood that the operational mode 400 may be practiced by a workload placement system having a different configuration than that set forth in the block diagram 200.

The operational mode 400 may be implemented to scale down power in each zone of influence 130a-130n to ensure that there is sufficient capacity in the CRAC units 114a-114n should at least one of the CRAC units 114a-114n fail. Thus, for instance, should a CRAC unit 114a fail, there may be sufficient capacity in the remaining CRAC units 114b-114n to perform the workload of the servers 216a-216n contained in the zone 130a of the CRAC unit 114a. In one respect, through implementation of the operational mode 400, the potential reduction in workflow caused by a CRAC unit 114a failure may substantially be minimized.

As shown, the operational mode 400 includes all of the steps 302-314 disclosed and described herein above with respect to the operational mode 300. Therefore, a detailed description of steps 302-314 will be omitted and the description with respect to the operational mode 300 will be relied upon as providing a sufficient description of these steps.

Therefore, beginning at step 402, the resource manager 128 may determine whether the sum of the actual capacity utilizations (AC) of the CRAC units 114a-114n exceeds or equals a value X. The value X may be defined as a predefined percentage of the sum of the rated capacities. In addition, the value X may also comprise a user-defined value and may be based upon a variety of factors. By way of example, the value X may be determined based upon levels of loading on individual CRAC units 114a-114n. In this example, the value X may be weighted, for instance, according to the proximity of the CRAC units 114a-114n to their rated maximum capacities. Thus, if a CRAC unit 114a is operating close to its rated maximum capacity, this fact may be given relatively greater weight in determining the value of X. As another example, the value X may be determined based upon factors including, redundancy in cooling, response time of the CRAC units 114a-114n, air delivery infrastructure in the data center 100, etc.

If it is determined that the sum of the actual capacity utilizations of the CRAC units 114a-114n falls below the sum of their rated capacities, the operational mode 400 may be repeated beginning at step 306. If, however, it is determined that the sum of the actual capacity utilizations of the CRAC units 114a-114n equals or exceeds the sum of their rated capacities, the resource manager 128 may scale down power in the servers 216a-216n contained in each zone of influence 130a-130e, as indicated at step 404. The power in the servers 216a-216n may be scaled down by lowering the performance or the p-states of processor(s) 222 contained in the servers 216a-216n as described herein above.

Following the scale down of power as indicated at step 404, the operational mode 400 may be repeated beginning at step 304. In addition, the operational mode 400 may be continued for a predetermined length of time, for a predetermined number of iterations, until the operational mode 400 is manually discontinued, etc.

The operations set forth in the operational modes 300 and 400 may be contained as a utility, program, or subprogram, in any desired computer accessible medium. In addition, the operational modes 300 and 400 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
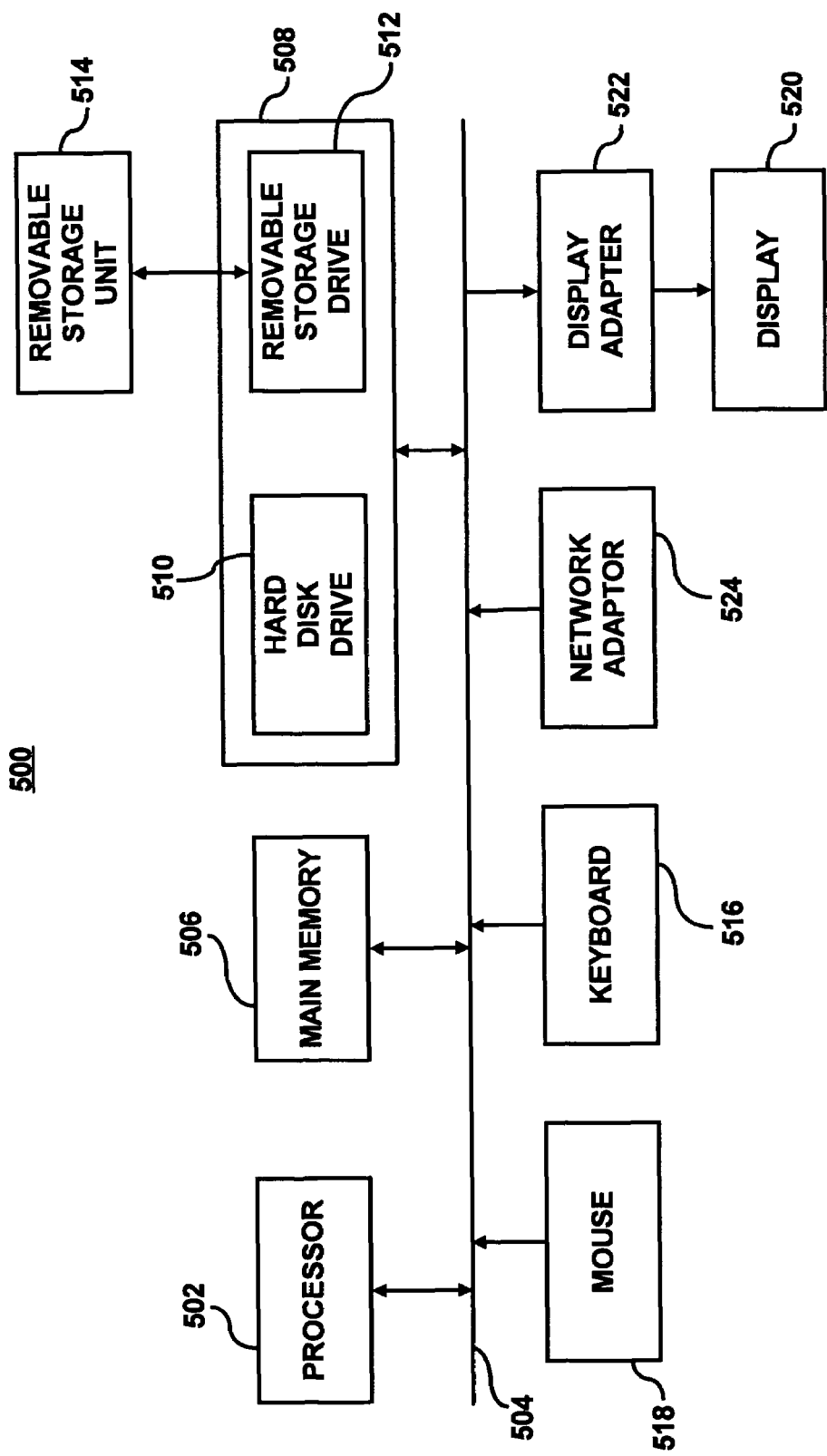
FIG. 5 illustrates a computer system, which may be employed to perform the various functions of the workload placement system described herein, according to an embodiment of the invention.

FIG. 5 illustrates a computer system 500, which may be employed to perform the various functions of the resource manager 128 described hereinabove, according to an embodiment. In this respect, the computer system 500 may be used as a platform for executing one or more of the functions described hereinabove with respect to the resource manager 128.

The computer system 500 includes one or more controllers, such as a processor 502. The processor 502 may be used to execute some or all of the steps described in the operational modes 300 and 400. Commands and data from the processor 502 are communicated over a communication bus 504. The computer system 500 also includes a main memory 506, such as a random access memory (RAM), where the program code for, for instance, the resource manager 128, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the provisioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of workload placement based upon capacity utilizations of a plurality of CRAC units, said method comprising:
    determining the provisioning of the plurality of CRAC units;
    determining the zone of influence for each of the plurality of CRAC units based upon the provisioning of the plurality of CRAC units;
    determining whether a CRAC unit of the plurality of CRAC units is at least one of near failure or has failed; and
    shifting the workload from a zone of influence of at least one CRAC unit to a zone of influence of another of the plurality of CRAC units in response to a determination that a CRAC unit is at least one of near failure or has failed.

2. The method according to claim 1, further comprising:
    calculating actual loads on the plurality of CRAC units,
    calculating the difference between a sum of the actual loads and a sum of the rated capacities of the plurality of CRAC units; and
    wherein the step of shifting the workload comprises shifting the workload in response to the sum of the actual loads falling below the sum of the rated capacities.

3. The method according to claim 1, further comprising:
    determining whether the remaining plurality of CRAC units has sufficient capacity to redistribute the workload; and
    wherein the step of shifting the workload comprises shifting the workload in response to a determination that there is sufficient capacity in the remaining plurality of CRAC units.

4. The method according to claim 3, further comprising:
    calculating the actual available capacity in each of the remaining plurality of CRAC units in response to a determination that there is sufficient capacity; and
    wherein the step of shifting the workload comprises shifting the workload to the zones of influence of the remaining plurality of CRAC units based on the actual available capacities of the remaining plurality of CRAC units.

5. The method according to claim 4, further comprising:
    re-calculating actual loads on the remaining plurality of CRAC units; and
    determining whether the actual loads on the remaining plurality of CRAC units have reached the rated capacities of the remaining plurality of CRAC units.

6. The method according to claim 5, further comprising:
    determining whether additional workload is to be shifted in response to the actual loads an the remaining plurality of CRAC units falling below the rated capacities of the remaining plurality of CRAC units; and
    shifting the workload to the zones of influence of the remaining plurality of CRAC units based on the actual available capacities of the remaining plurality of CRAC units in response to a determination that additional workload is to be shifted.

7. The method according to claim 5, further comprising:
    determining the provisioning levels of the remaining plurality of CRAC units in response to the actual loads on the remaining plurality of CRAC units reaching the rated capacities of the remaining plurality of CRAC units;
    determining whether the provisioning levels of the CRAC units is safe; and
    scaling down power in servers of a zone of influence of a CRAC unit in response to a determination that the provisioning level of the CRAC unit is unsafe.

8. The method according to claim 7, wherein the servers have at least one processor, and wherein the step of scaling down power in servers comprises scaling down at least one or both of the performance and p-states of the at least one processor.

9. The method according to claim 1, further comprising
    projecting results of one or more workload shifting scenarios;
    generating at least one projected deployment map based upon projected results;
    selecting one of the at least one projected deployment maps; and
    wherein the step of shifting the workload comprises shifting the workload according to the selected one of the at least one projected deployment map.

10. The method according to claim 1, further comprising:
    generating a plurality of failure mitigation maps configured to model a plurality of workload distribution scenarios; and
    wherein the step of shifting the workload comprises shifting the workload according to one of the plurality of failure mitigation maps.

11. The method according to claim 1, wherein at least one of the plurality of CRAC units is located in a separate data center from the remaining plurality of CRAC units, and wherein the step of shifting the workload comprises shifting the workload to a zone of influence of the at least one of the CRAC units in the separate data center.

12. A method of providing sufficient capacity in a plurality of CRAC units to compensate for the failure of at least one of the plurality of CRAC units, said method comprising:
    determining the provisioning of the plurality of CRAC units;
    determining the zone of influence for each of the plurality of CRAC units based upon the provisioning of the plurality of CRAC units;
    calculating actual loads of the plurality of CRAC units;
    determining whether a sum of the actual loads equals or exceeds a predefined percentage of a sum of the rated capacities of the plurality of CRAC units; and
    scaling down power in servers in each zone of influence in response to the sum of the actual loads equaling or acceding the predefined percentage of the sum of the rated capacities, to thereby provide sufficient capacity in the plurality of CRAC units to compensate for the failure of at least one of the plurality of CRAC units.

13. The method according to claim 12, wherein the servers have at least one processor and wherein the step of scaling down power in servers comprises sealing down at least one or both of the performance and p-states of the at least one processor.

14. The method according to claim 12, wherein the step of scaling down power in the servers comprises scaling down power in the servers to a level cause the sum of the capacity utilizations to fall below the predefined percentage at the sum of the rated capacities.

15. A workload placement system comprising:
a resource manager;
a memory in communication with the resource manager, said memory comprising a module for calculating the actual loads of a plurality of CRAC units, said memory further comprising a module for determining placement of workload among a plurality of servers based upon the actual loads of the plurality of CRAC units;
wherein the resource manager is configured to determine available capacities in the plurality of CRAC units in response to at least one of a failure and a potential failure in a CRAC unit of the plurality of CRAC units; and
wherein the resource manager is further configured to shift the workload to at least one server in a zone of influence of at least one of the plurality of CRAC units having available capacity.

16. The workload placement system according to claim 15, wherein the resource manager is further configured to scale down power in one or more of the servers of a zone of influence of a CRAC unit.

17. The workload placement system according to claim 16, wherein the servers have at least one processor, and wherein the resource manager is configured to scale down at least one or both of the performance and p-states of the at least one processor.

18. The workload placement system according to claim 15, wherein the resource manager is further configured to generate at least one map depicting at least one projected deployment scenario, and wherein the resource manager is further configured to shift the workload based upon the at least one map.

19. The workload placement system according to claim 15, wherein at least one of the plurality of CRAC units is located in a separate data center from the remaining plurality of CRAC units, and wherein the resource manager is further configured to shift the workload to at least one server in a zone of influence of the at least one of the plurality of CRAC units located in the separate data center.

20. A data center comprising:
a plurality of CRAC units,;
means for determining the provisioning of the plurality of CRAC units;
means for determining the zone of influence for each of the plurality of CRAC units;
means for determining whether a CRAC unit of the plurality of CRAC units is at least one of near failure or has failed; and
means for shifting the workload from a zone of influence of at least one CRAC unit to a zone of influence of another of the plurality of CRAC units based upon whether a CRAC unit has been determined to be at least one of near failure or has failed.

21. The data center according to claim 20, further comprising:
means for scaling down at least one or both of the performance and p-states of at least one processor.

22. The data center according to claim 20, further comprising:
means for generating at least one map depicting at least one projected deployment scenario, and wherein the means for shifting the workload is configured to shift the workload based upon the at least one map.

23. A computer readable storage medium on which is embedded one or more computer programs, said one or more computer programs implementing a method of workload placement based upon capacity utilizations of a plurality of CRAC units, said one or more computer programs comprising a set of instructions for:
determining the provisioning of the plurality of CRAC units;
determining the zone of influence for each of the plurality of CRAC units based upon the provisioning of the plurality of CRAC units;
determining whether a CRAC unit of the plurality of CRAC units is at least one of near failure or has failed; and
shifting the workload from a zone of influence of at least one CRAC unit to a zone of influence of another of the plurality of CRAC units in response to a determination that a CRAC unit is at least one of near failure or has failed.

24. The computer readable storage medium according to claim 23, said one or more computer programs further comprising a set of instructions for:
calculating actual loads on the plurality of CRAC units,
calculating the difference between a sum of the actual loads and a sum of the rated capacities of the plurality of CRAC units; and
wherein the step of shifting the workload comprises shifting the workload in response to the sum of the actual loads falling below the sum of the rated capacities.

25. The computer readable storage medium according to claim 23, said one or more computer programs further comprising a set of instructions for:
projecting results of one or more workload shifting scenarios;
generating at least one projected deployment map based upon projected results;
selecting one of the at least one projected deployment maps; and
wherein the step of shifting the workload comprises shifting the workload according to the selected one of the at least one projected deployment map.

* * * * *

UNITED STATES PATENT AND TRADEMARK OFFICE
CERTIFICATE OF CORRECTION

PATENT NO. : 7,426,453 B2 Page 1 of 1
APPLICATION NO. : 11/035320
DATED : September 16, 2008
INVENTOR(S) : Chandrakant D. Patel et al.

It is certified that error appears in the above-identified patent and that said Letters Patent is hereby corrected as shown below:

In column 11, line 36, delete "1114a-114n" and insert -- 114a-114n --, therefor.

In column 17, line 65, in Claim 6, after "loads" delete "an" and insert -- on --, therefor.

In column 18, line 59, in Claim 12, delete "acceding" and insert -- exceeding --, therefor.

In column 18, line 64, in Claim 13, after "processor" insert -- , --.

In column 18, line 65, in Claim 13, delete "sealing" and insert -- scaling --, therefor.

In column 19, line 4, in Claim 14, after "percentage" delete "at" and insert -- of --, therefor.

In column 19, line 46, in Claim 20, delete "units,;" and insert -- units; --, therefor.

Signed and Sealed this

Eleventh Day of August, 2009

David J. Kappos
*Director of the United States Patent and Trademark Office*